US007147479B1

(12) United States Patent
Ho

(10) Patent No.: US 7,147,479 B1
(45) Date of Patent: Dec. 12, 2006

(54) ELECTRICAL CONNECTOR

(75) Inventor: Chien-Chih Ho, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/349,133

(22) Filed: Feb. 8, 2006

(51) Int. Cl.
*H01R 12/00* (2006.01)
*H01R 13/40* (2006.01)

(52) U.S. Cl. ......................... 439/66; 439/936; 439/591

(58) Field of Classification Search .................. 439/66, 439/91, 591, 936
See application file for complete search history.

(56) References Cited

U.S. PATENT DOCUMENTS 4,913,656 A * 4/1990 Gordon et al. ................ 439/67
5,061,192 A * 10/1991 Chapin et al. ................ 439/66
5,934,934 A * 8/1999 Ward .......................... 439/521
5,938,451 A * 8/1999 Rathburn ..................... 439/66
6,329,607 B1 * 12/2001 Fjelstad et al. ............. 174/261
6,409,521 B1 * 6/2002 Rathburn ..................... 439/66

* cited by examiner

*Primary Examiner*—Briggitte R. Hammond
(74) *Attorney, Agent, or Firm*—Rosenberg, Klein & Lee

(57) ABSTRACT

An electrical connector includes an insulation body and a conducting pin received in the insulation body. The conducting pin includes a body and a flexible contacting arm that flexibly and compressively contacts an external electronic element. On the backside of the flexible contacting arm, there is a flexible colloid that prevents the flexible contacting arm of the pins from becoming permanently deformed when the conducting pin is pressed. The electrical connector of the present invention has the following merits: there is a flexible colloid located on the backside of the flexible contacting arm to prevent the flexible contacting arm of the pins from becoming permanently deformed. The electrical connection between the conducting pin and the external electronic element is thereby assured.

10 Claims, 6 Drawing Sheets

ELECTRICAL CONNECTOR

BACKGROUND OF THE INVENTION

1. Field of the Invention

The present invention relates to an electrical connector. In particular, this invention relates to an electrical connector that prevents the flexible contacting arm of the pins from becoming permanently deformed.

2. Description of the Related Art

Some electronic products (such as computers) adopt a chip module having a land grid array (LGA). The conduct-contacting end of the chip module has a washer shape. The electrical connector used for connecting the chip module to the circuit board includes conducting pins that compressively contacts the conduct-contacting ends. Please refer to FIG. 1 and FIG. 2, which show a schematic diagram of the electrical connector of the prior art. The electrical connector includes an insulation body 80, a conducting pin 60, and a soldering ball 70 located below the conducting pin. The conducting pin has a flexible arm 601 protruding from the upper surface of the insulation body 80. The end of the flexible arm 601 has a contacting part 602. When the chip module (not shown in the figure) is assembled with the electrical connector, the chip module is pressed from up to down to electrically connect with the contacting part 602 located at the end of the flexible arm 601. Therefore, the chip module is electrically connected with the circuit board (not shown in the figure). However, the electrical connector has the following drawback. Because the forward force of the contacting part of the flexible arm is smaller and the contacting force from the chip mold board pressing on the conducting pin is larger, the flexible arm of the conducting pin is easily permanently deformed. Therefore, the function of the electrical connector is affected.

SUMMARY OF THE INVENTION

One particular aspect of the present invention is to provide an electrical connector that prevents the flexible contacting arm of the pins from becoming permanently deformed.

The electrical connector of the present invention includes an insulation body and a conducting pin received in the insulation body. The conducting pin includes a body and a flexible contacting arm that flexibly and compressively contacts an external electronic element. On the backside of the flexible contacting arm, there is a flexible colloid that prevents the flexible contacting arm of the pins from becoming permanently deformed, when the conducting pin is pressed.

The electrical connector of the present invention has the following merits. There is a flexible colloid located on the backside of the flexible contacting arm to prevent the flexible contacting arm of the pins from becoming permanently deformed. The electrical connection between the conducting pin and the external electronic element is thereby assured.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

The detailed illustration is disclosed by the attached figures and the embodiments.

Figure 1:
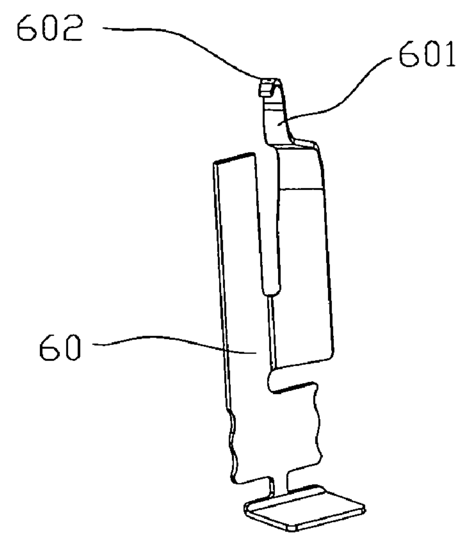
FIG. 1 is a perspective view of the pin of the prior art.
Figure 2:
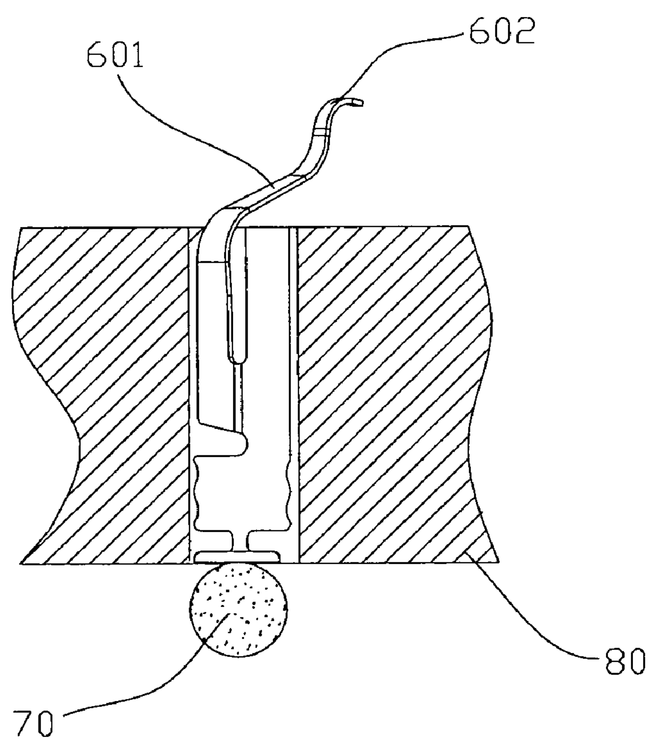
FIG. 2 is a cross-sectional view of part of the electrical connector of the prior art.
Figure 3:
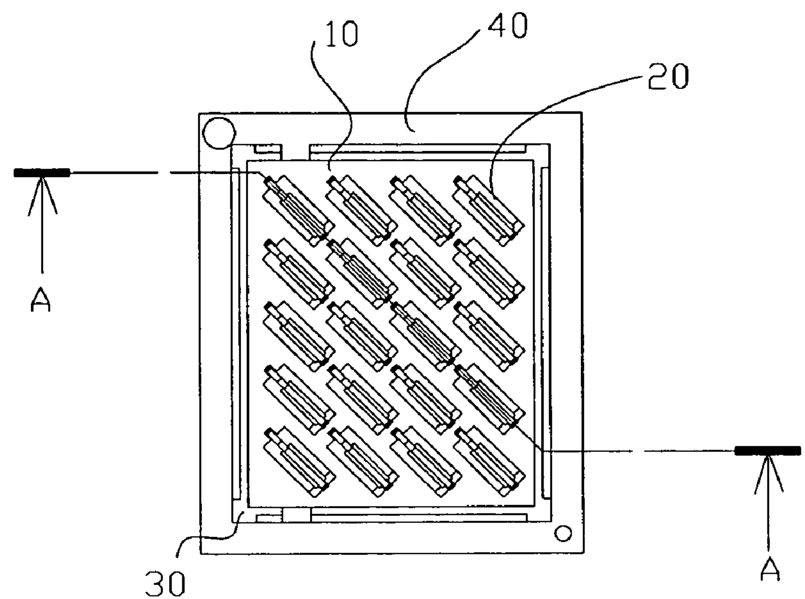
FIG. 3 is a top view of the electrical connector of the present invention.
Figure 4:
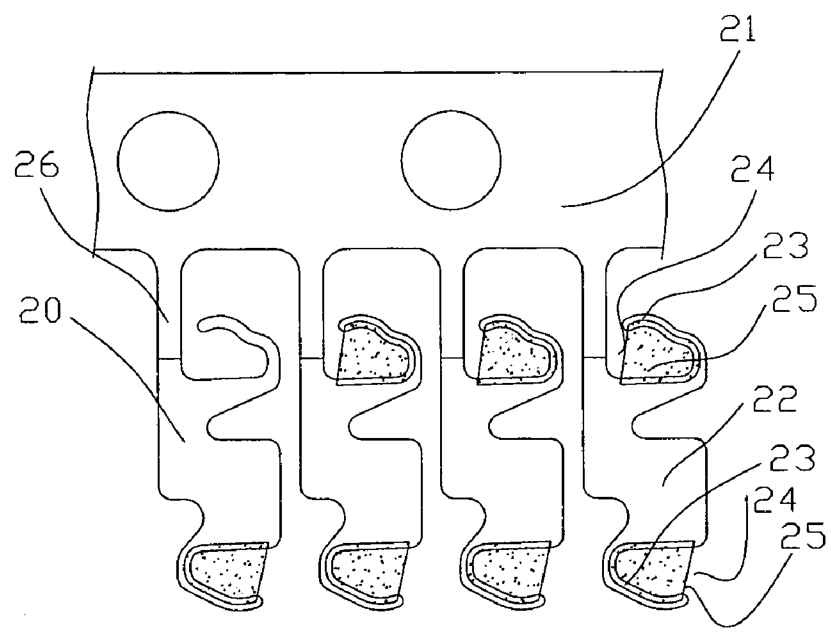
FIG. 4 is an assembly view of the conducting pin connected with the material belt.
Figure 7:
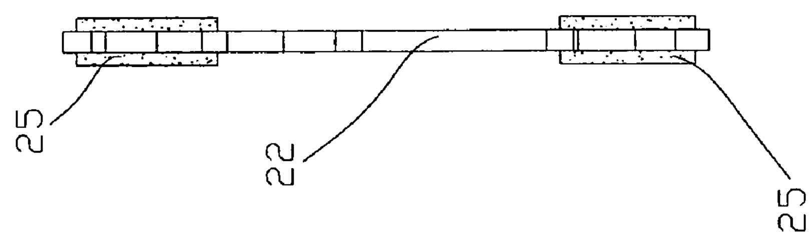
FIG. 7 is a side view of FIG. 5.
Figure 6:
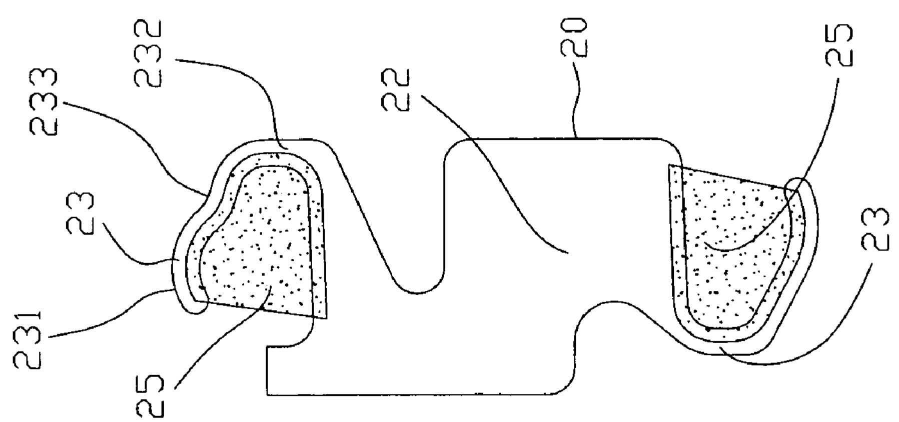
FIG. 6 is a front view of FIG. 5.
Figure 5:
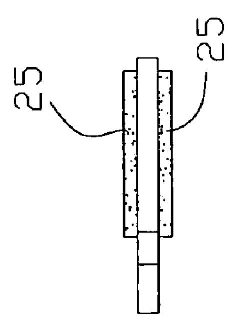
FIG. 5 is a top view of the conducting pin connected with the flexible colloid.
Figure 8:
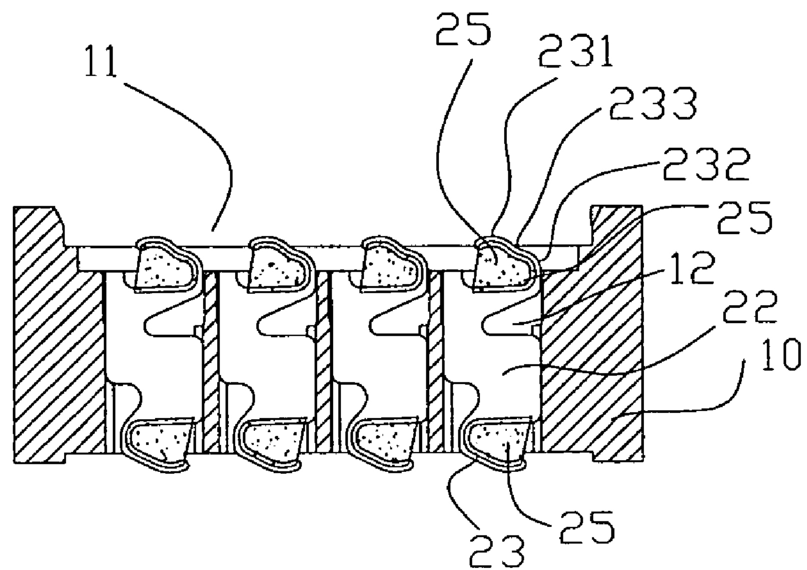
FIG. 8 is a schematic view of the electrical connector of the present invention when not being pressed by the chip mold board and the circuit board.
Figure 9:
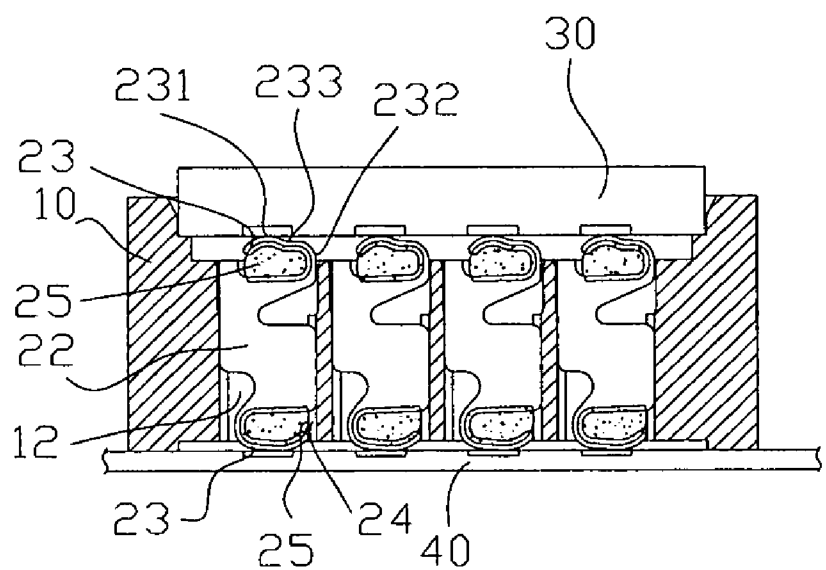
FIG. 9 is a schematic view of the electrical connector of the present invention as it is being pressed by the chip mold board and the circuit board.

Please refer to FIGS. 3~9. The electrical connector of the present invention is used for connecting the chip mold board 30 with the circuit board 40. The electrical connector includes an insulation body 10 and a conducting pin 20. The insulation body 10 has a receiving area 11 and a receiving hole 12 for individually receiving the chip mold board 30 and the conducting pin 20. The conducting pins are arranged in the insulation body 10 by a tilting method.

The conducting pin 20 is flake-shaped and includes a body 22, and two flexible contacting arms 23 that extend to the two ends of the body 22 in opposite directions. The flexible contacting arms 23 are located at the two ends of the conducting pin 20 and are formed by punching the conducting pin 20. The flexible contacting arm 23 includes a contacting point 231 for contacting with the chip mold board 30 and the circuit board 40, and a connecting part 232 connected with the body 22. There is a concave space 233 facing inward located between the contacting point 231 of the flexible contacting arm 23 that compressively contacts the chip mold board 30 and the connecting part 232. When the chip mold board 30 is pressed against the flexible contacting arm 23 of the conducting pin 20, the concave space 233 enhances the forward force between the contacting point 231 and the chip mold board 30 that are compressively contacted.

There is a connecting part 26 located on one side of the body 22 of the conducting pin 20. Before the conducting pin 20 is installed in the receiving hole 12 of the insulation body 10, the conducting pin 20 is connected with a material belt 21 via the connecting part 26. There is a receiving space 24 formed between the body 22 of the conducting pin 20 and the flexible contacting arm 23. There is a flexible colloid 25 located in the receiving space 25. The flexible colloid 25 is also located on the back side of the flexible contacting arm 23, and part of the body 22 and the flexible contacting arm 23 are wrapped up in the flexible colloid 25. The flexible colloid 25 is formed on the conducting pin 20 via an insert molding method (the flexible colloid 25 can also be formed in the receiving space via an embedding method or a similar method). When the chip mold board 30 and the circuit board 40 compressively contact the flexible contacting arm 23 of the conducting pin 20, the flexible colloid 25 prevents the flexible contacting arm 23 from becoming permanently deformed.

Figure 10:
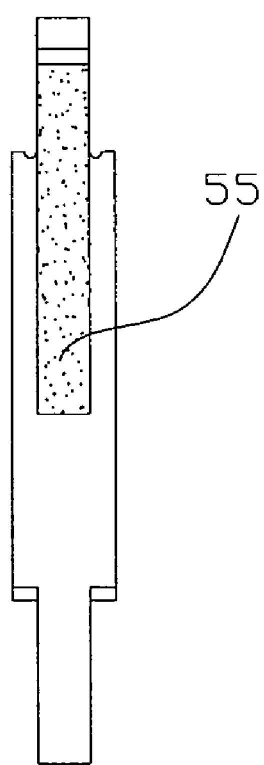
FIG. 10 is a side view of the conducting pin connected with the flexible colloid of another embodiment of the present invention.
Figure 11:
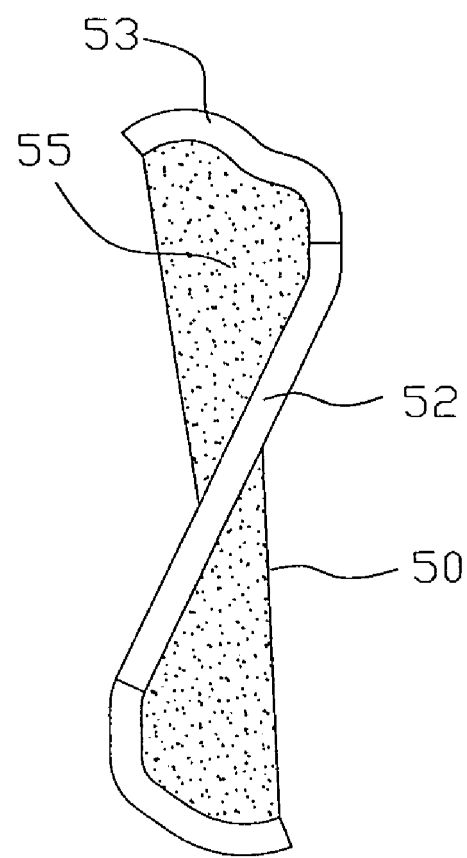
FIG. 11 is a top view of FIG. 10.
Figure 12:
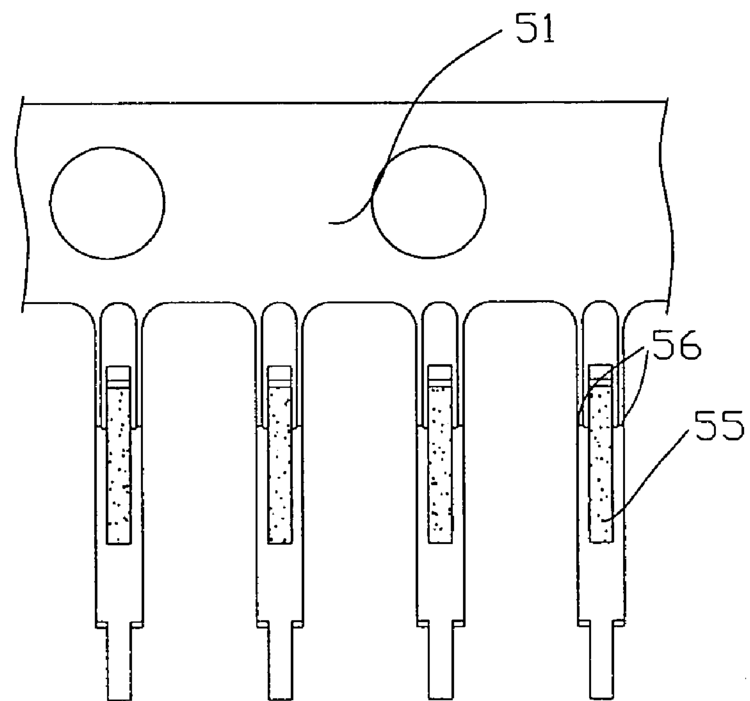
FIG. 12 is an assembly view of the conducting pin connected with the material belt of FIG. 10.
Figure 13:
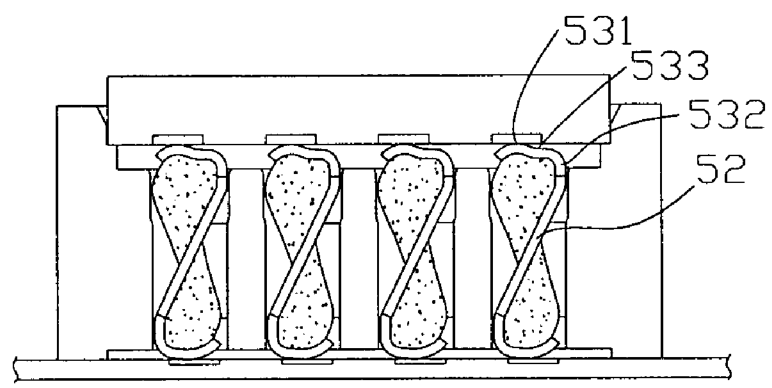
FIG. 13 is a schematic view of the electrical connector that is pressed with the chip mold board and the circuit board of another embodiment of the present invention.

FIGS. 10~13 show the second embodiment of the present invention. The difference between the first embodiment and the second embodiment is that the flexible contacting arm 53 of the conducting pin 50 is formed by bending the two ends of the conducting pin 50. The flexible colloid 55 is received in the flexible contacting arm 53. When the chip mold board and the circuit board compressively contact the flexible contacting arm 53 of the conducting pin 50, the flexible colloid 55 prevents the flexible contacting arm 53 from becoming permanently deformed. The conducting pin 50 also includes a body 52. A connecting part 56 is located at each of the two sides of body 52, and the connecting part 56 is connected with the material belt 51. The flexible contacting arm 53 has a contacting point 531 that contacts the chip mold board and the circuit board. The flexible contacting arm 53 also has a linking part 532 that is connected with the body 52. A concave space 533 is located between the contacting point 531 and the linking part 532 of the flexible contacting arm 53 that compressively contacts the chip mold board 30.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An electrical connector, comprising:

an insulation body; and a conducting pin received in the insulation body;

wherein the conducting pin includes a body and a flexible contacting arm that flexibly and compressively contacts an external electronic element, there is also a flexible colloid located on the backside of the flexible contacting arm that prevents the flexible contacting arm of the conducting pin from becoming permanently deformed, when the conducting pin is pressed.

2. The electrical connector as claimed in claim 1, wherein the flexible colloid is formed on the conducting pin via an insert molding method.

3. The electrical connector as claimed in claim 1, wherein the conducting pin is flake-shaped, and the flexible contacting arms are punched at the two ends of the conducting pin.

4. The electrical connector as claimed in claim 1, wherein the flexible contacting arms are formed at the two ends of the conducting pin via a bending method.

5. The electrical connector as claimed in claim 1, wherein the flexible contacting arm comprises a contacting point that contacts an external electronic element and a linking part that is connected with the body, and a concave space that is inward facing, located between the contacting point and the linking part.

6. The electrical connector as claimed in claim 1, wherein the conducting pins are arranged in the insulation body via a tilting method.

7. The electrical connector as claimed in claim 1, wherein there are two flexible contacting arms, and the flexible contacting arms extend from the two ends of the body.

8. The electrical connector as claimed in claim 7, wherein the flexible contacting arms extend from the two ends of the body in opposite directions.

9. The electrical connector as claimed in claim 1, wherein a receiving space is formed between the body of the conducting pin and each of the flexible contacting arms, and the flexible colloid is located in the receiving space.

10. The electrical connector as claimed in claim 9, wherein part of the body and the flexible contacting arm are wrapped in the flexible colloid.

* * * * *